(12) United States Patent
Choi

(10) Patent No.: US 7,023,742 B2
(45) Date of Patent: Apr. 4, 2006

(54) SEMICONDUCTOR DEVICE AND METHOD FOR INPUTTING/OUTPUTTING DATA SIMULTANEOUSLY THROUGH SINGLE PAD

(75) Inventor: Jung-Hwan Choi, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/819,678

(22) Filed: Apr. 6, 2004

(65) Prior Publication Data

US 2004/0223365 A1   Nov. 11, 2004

(30) Foreign Application Priority Data

May 7, 2003   (KR)   ................ 10-2003-0028876

(51) Int. Cl.
    *G11C 7/00*   (2006.01)
(52) U.S. Cl. ................ 365/189.04; 365/189.03; 365/189.05
(58) Field of Classification Search ........... 365/189.04, 365/189.03, 189.05
    See application file for complete search history.

(56) References Cited

U.S. PATENT DOCUMENTS

| | | | |
|---|---|---|---|
| 5,235,552 A * | 8/1993 | Nakajima et al. ...... | 365/230.05 |
| 5,532,621 A * | 7/1996 | Kobayashi et al. ........ | 326/86 |
| 5,680,365 A * | 10/1997 | Blankenship .......... | 365/230.05 |
| 5,872,471 A | 2/1999 | Ishibashi et al. ............. | 327/98 |
| 5,903,514 A * | 5/1999 | Sawada ...................... | 365/233 |
| 5,926,426 A * | 7/1999 | Han ........................... | 365/205 |
| 6,075,728 A * | 6/2000 | Inoue et al. ........... | 365/189.01 |
| 6,115,317 A * | 9/2000 | Kim ....................... | 365/230.06 |
| 6,127,849 A | 10/2000 | Walker ..................... | 326/86 |
| 6,157,560 A * | 12/2000 | Zheng ........................ | 365/63 |
| 6,687,181 B1 * | 2/2004 | Usuki et al. ........... | 365/230.03 |
| 6,690,191 B1 * | 2/2004 | Wu et al. .................... | 326/30 |

FOREIGN PATENT DOCUMENTS

| | | |
|---|---|---|
| JP | 10-303728 | 11/1998 |
| KR | 1997-76803 | 12/1997 |

OTHER PUBLICATIONS

English language abstract of Japanese Publication No. 10-303728.
English language abstract of Korean Publication No. 1997-76803.

* cited by examiner

*Primary Examiner*—Son Mai
(74) *Attorney, Agent, or Firm*—Marger Johnson & McCollom, P.C.

(57) ABSTRACT

Provided are a semiconductor device and a method for inputting and outputting data simultaneously through a single bi-directional pad. The semiconductor device includes a bi-directional input/output pad including an output buffer and an input buffer, a data output line coupled to the output buffer, and a data input line coupled to the input buffer. A bit line sense amplifier is coupled to a plurality of bit lines. A first switching circuit is coupled to the data output line. And a second switching circuit is coupled to the data input line.

14 Claims, 7 Drawing Sheets

SEMICONDUCTOR DEVICE AND METHOD FOR INPUTTING/OUTPUTTING DATA SIMULTANEOUSLY THROUGH SINGLE PAD

RELATED APPLICATION INFORMATION

This application claims priority from Korean Patent Application No. 2003-28876, filed on May 7, 2003, in the Korean Intellectual Property Office, the disclosure of which is incorporated by reference in its entirety.

BACKGROUND

1. Field of the Invention

The present invention relates to a semiconductor device, and more particularly, to a semiconductor device and a method of inputting and outputting data simultaneously and bi-directionally to and through a single bi-directional input/output pad.

2. Description of the Related Art

FIG. 1 is a block diagram of a data input/output circuit in a conventional semiconductor device. Referring to FIG. 1, a semiconductor device 100 includes a memory bank 10, an input buffer 50, an output buffer 60, and a data input/output pin (generally called a DQ) 70.

A data write operation will be briefly described with reference to FIG. 1. Once an input signal is provided (or input) to the input buffer 50 through the data input/output pin 70, the input buffer 50 buffers the input signal responsive to a write enable signal W_EN and transmits buffered differential signals to a bit line sense amplifier 20 through a pair of input/output lines IO and IOB and transistors 30 and 40.

In the data write operation, the transistors 30 and 40 are turned on responsive to an activated column select signal CSL. The bit line sense amplifier 20 receives and amplifies the buffered differential signals and writes the amplified signals to corresponding memory cells MC1 and MC2.

A data read operation will be briefly described with reference to FIG. 1. In the data read operation, the bit line sense amplifier 20 amplifies a voltage difference between a pair of bit lines BL and BLB and transmits the amplified voltage difference to the pair of input/output lines IO and IOB through the transistors 30 and 40. In the data write operation, the transistors 30 and 40 are turned on responsive to the activated column select signal CSL.

An output buffer 60 receives the signals on the pair of input/output lines IO and IOB, buffers the received signals responsive to a read enable signal R_EN, and transmits the buffered signals through the data input/output pin 70.

Since the semiconductor device 100 uses the same input/output lines IO and IOB for data input/output, the data write operation and the data read operation cannot occur simultaneously through the single data input/output pin 70.

The semiconductor device 100, therefore, must perform data write and read operations sequentially.

SUMMARY

The present invention provides a semiconductor device and a method of inputting/outputting data substantially simultaneously through a single bi-directional input/output pad.

In an embodiment, the semiconductor device includes a bi-directional input/output pad including an output buffer and an input buffer, a data output line coupled to the output buffer, and a data input line coupled to the input buffer. A bit line sense amplifier is coupled to a plurality of bit lines. A first switching circuit is coupled to the data output line. And a second switching circuit is coupled to the data input line.

The input buffer compares an input signal from the bi-directional input/output pad with a reference voltage from the output buffer and the input buffer generates an output signal as a result of the comparison.

In an embodiment, the semiconductor device includes a bi-directional input/output pad including an output buffer and an input buffer, a data output path formed between a first memory cell and the output buffer, and a data input path formed between a second memory cell and the input buffer.

The input buffer compares an input signal with a reference voltage and generates a signal responsive to the comparison.

In an embodiment, the semiconductor device includes a plurality of memory banks; and a bi-directional input/output pad to input and output data. Each of the plurality of memory banks includes a plurality of memory cells, a data output line to transmit read data from a corresponding memory cell to the bi-directional input/output pad in a read mode, and a data input line to transmit write data to a corresponding memory cell from the bi-directional input/output pad in a write mode. The read mode is performed in one memory bank, the read data is transmitted to the bi-directional input/output pad through the data output line. The write mode is performed in another memory bank, the write data is transmitted to the data input line from the bi-directional input/output pad.

In an embodiment, the semiconductor device includes a plurality of memory banks and a bi-directional input/output pad. Each of the plurality of memory banks includes a data output path formed between a first memory cell and the bi-directional input/output pad responsive to a first column select signal and a data input path formed between a second memory cell and the bi-directional input/output pad responsive to a second column select signal. The first column select signal for one memory bank and the second column select signal for another memory bank are activated substantially simultaneously.

The bi-directional input/output pad includes an output buffer and an input buffer. The data output path is formed between the first memory cell and the output buffer and the data input path is formed between the second memory cell and the input buffer.

In an embodiment, the method for inputting and outputting data through a single bi-directional input/output pad coupled to a data output line and a data input line includes transmitting read data from a first memory cell through the data output line to the bi-directional input/output pad and substantially simultaneously transmitting write data from the bi-directional input/output pad through the data input line to a second memory cell of a second memory bank.

The method further includes coupling the data output line between the bi-directional input/output pad and the first memory cell and coupling the data input line between the bi-directional input/output pad and the second memory cell, the data input line being separate from the data output line.

The coupling the data output line and coupling the data input line occur substantially simultaneously.

The method further includes generating a first column select signal and a second column select signal and coupling the data output line between the bi-directional input/output pad and the first memory cell responsive to the first column select signal, and substantially simultaneously coupling the data input line between the bi-directional input/output pad and the second memory cell responsive to the second column select signal, the data input line being distinct from the data output line.

BRIEF DRAWING DESCRIPTION

The above and other aspects and advantages of the present invention will become more apparent by describing in detail exemplary embodiments with reference to the attached drawings.

DETAILED DESCRIPTION

Figure 1:
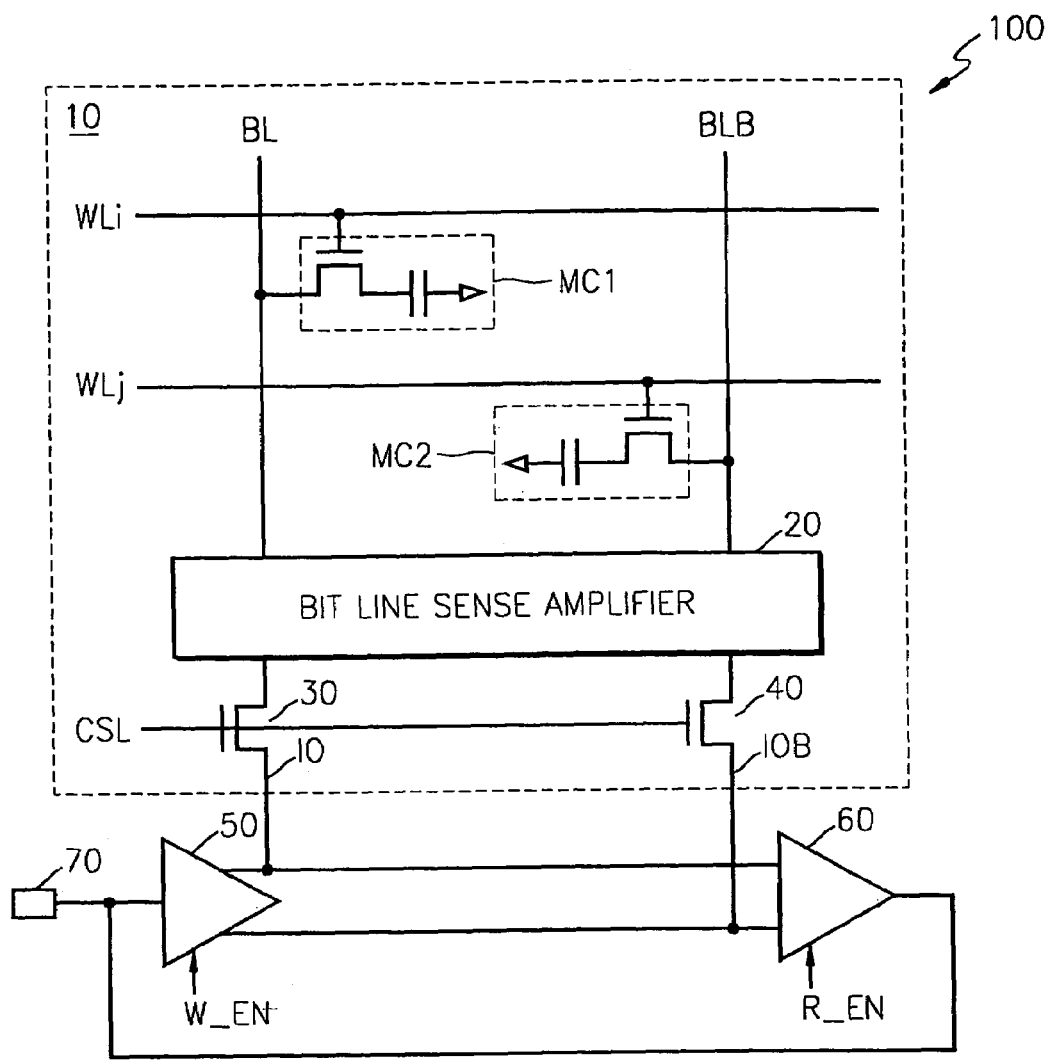
FIG. 1 is a block diagram of a data input/output circuit in a conventional semiconductor device.

The present invention will now be described more fully with reference to the accompanying drawings, in which embodiments of the invention are shown. Like reference numerals are used to refer to like elements throughout the drawings.

Figure 2:
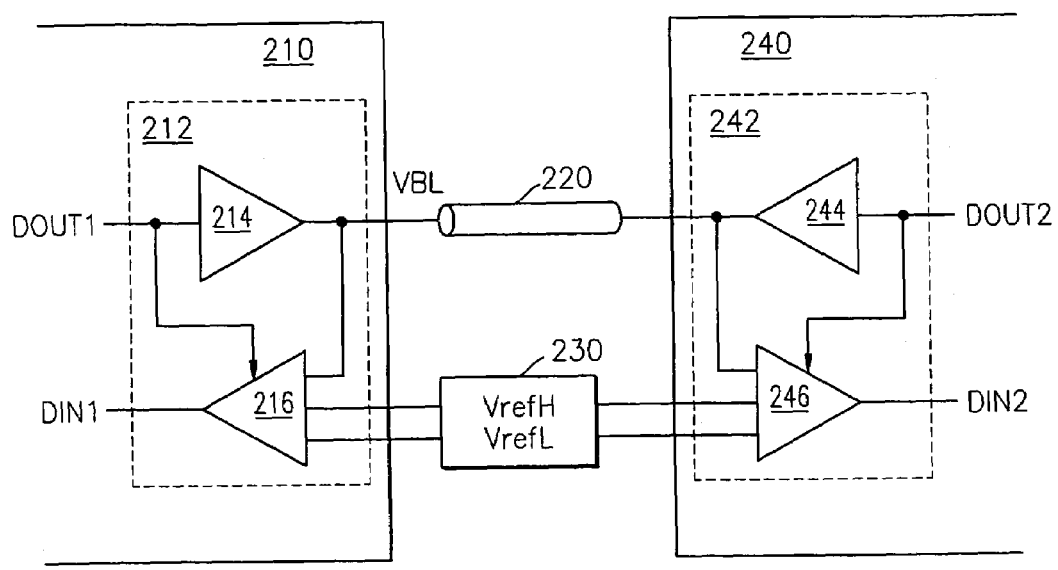
FIG. 2 is a block diagram of an input/output system utilizing a bi-directional input/output pad.

FIG. 2 is a block diagram of an input/output system utilizing a bi-directional input/output pad. Referring to FIG. 2, a first semiconductor device 210, the input/output system includes a second semiconductor device 240, a bus (or referred to as a channel) 220, and a reference voltage generating circuit 230.

The first semiconductor device 210 includes a simultaneous, bi-directional input/output pad 212 that has an output buffer 214 and an input buffer 216.

The second semiconductor device 240 includes a simultaneous, bi-directional input/output pad 242 that has an output buffer 244 and an input buffer 246.

The bus 220 is connected between the simultaneous, bi-directional input/output pads 212 and 242. The reference voltage generating circuit 230 supplies a first reference voltage VrefH and a second reference voltage VrefL to the input buffers 216 and 246.

Figure 3:
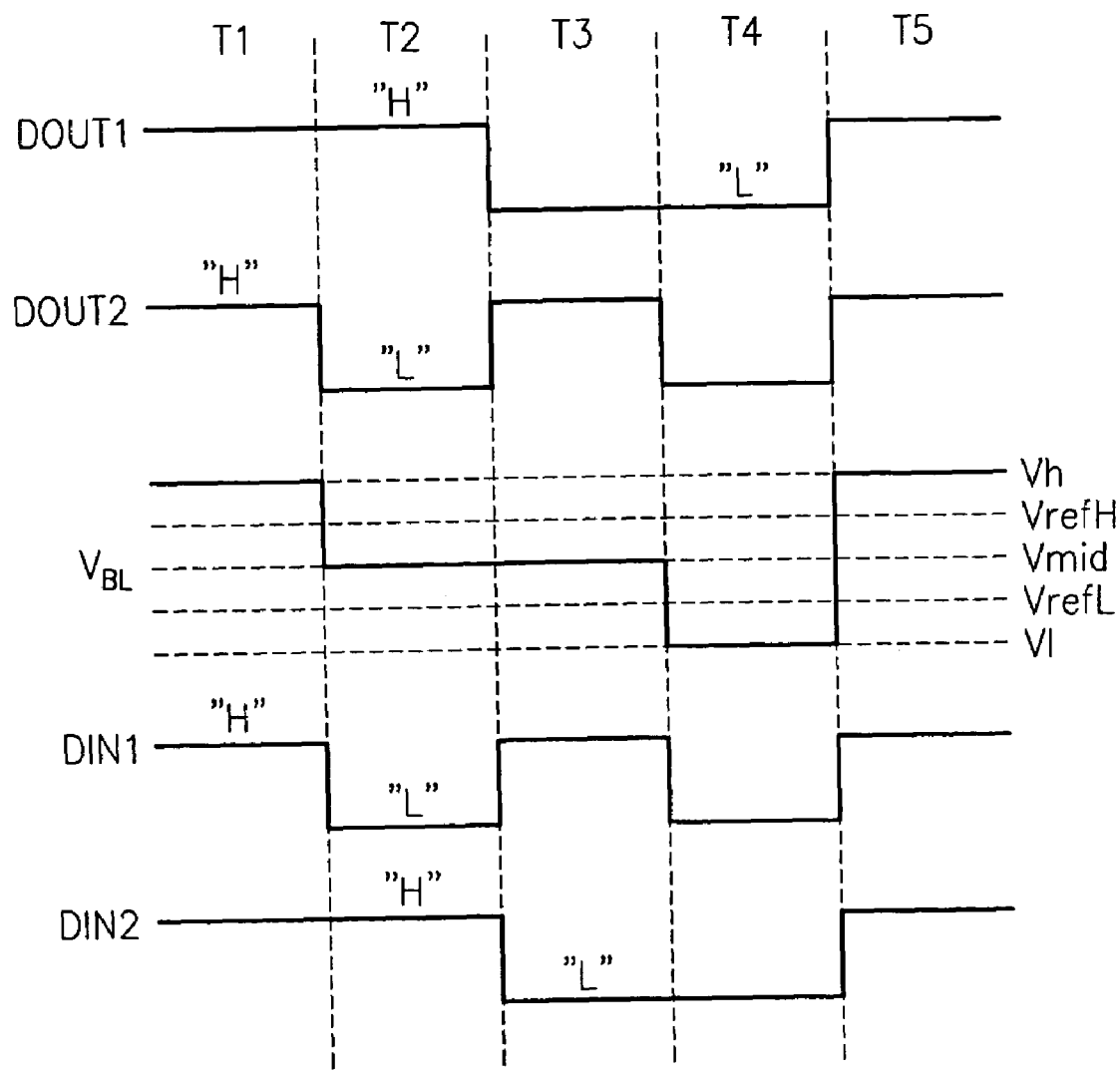
FIG. 3 is a waveform diagram of the bi-directional input/output pad shown in FIG. 2.

FIG. 3 is a waveform diagram of the bi-directional input/output pads 212 and 242 shown in FIG. 2. The input/output pads 212 and 242 operate as follows. Referring to FIGS. 2 and 3, during an interval T1, when a level of a first output signal DOUT1 is at a logic high "H" and a level of a second output signal DOUT2 is at a logic high "H", a signal $V_{BL}$ of the bus 220 has a logic high level "Vh".

The input buffer 216 compares the logic high level "Vh" of the signal $V_{BL}$ of the bus 220 to the first reference voltage VrefH responsive to the first output signal DOUT1 of the logic high level "H." The input buffer 216 outputs a first input signal DIN1 of the logic high level "H" responsive to the comparison. Here, a level of the first reference voltage VrefH is set to 75% of that of the first output signal DOUT1. A person of reasonable skill in the art should recognize that the high level first reference voltage VrefH (that is, Vh) might be set variously.

The input buffer 246 compares the logic high level "Vh" of the signal $V_{BL}$ of the bus 220 to the first reference voltage VrefH responsive to the second output signal DOUT2 of the logic high level "H". The input buffer 246 outputs a second input signal DIN2 of the logic high level "H" responsive to the comparison.

During an interval T2, when the level of the first output signal DOUT1 is logic high "H" and the level of the second output signal DOUT2 is low "L", the signal $V_{BL}$ of the bus 220 has a middle level "Vmid". Preferably, the middle level "Vmid" is set to 50% of the logic high level "Vh". A person of reasonable skill in the art should recognize that the mid level of the first reference voltage VrefH (that is, Vmid) might be set variously.

The input buffer 216 compares the middle level "Vmid" of the signal $V_{BL}$ of the bus 220 to the first reference voltage VrefH responsive to the first output signal DOUT1 of the logic high level "H." The input buffer 216 outputs a first input signal DIN1 of the low level "L" responsive to the comparison.

The input buffer 246 compares the middle level "Vmid" of the signal $V_{BL}$ of the bus 220 to the first reference voltage VrefH responsive to the second output signal DOUT2 of the low level "L." The input buffer 246 outputs the second input signal DIN2 of the logic high level "H" responsive to the comparison.

During an interval T4, when the level of the first output signal DOUT1 is low "L" and the level of the second output signal DOUT2 is low "L", the signal $V_{BL}$ of the bus 220 has a low level "Vl."

The input buffer 216 compares the low level "V1" of the signal $V_{BL}$ of the bus 220 to the second reference voltage VrefL responsive to the first output signal DOUT1 of the low level "L." The input buffer 216 outputs the first input signal DIN1 of the low level "L" responsive to the comparison.

The input buffer 246 compares the low level "V1" of the signal $V_{BL}$ of the bus 220 to the second reference voltage VrefL responsive to the second output signal DOUT2 of the low level "L." The input buffer 246 outputs the second input signal DIN2 of the low level "L" responsive to the comparison. The operation of the input/output pads 212 and 242 should be obvious to those of skill in the art during the intervals T3 and T5. The description of the intervals T3 and T5 will not be discussed in any further detail.

Figure 4:
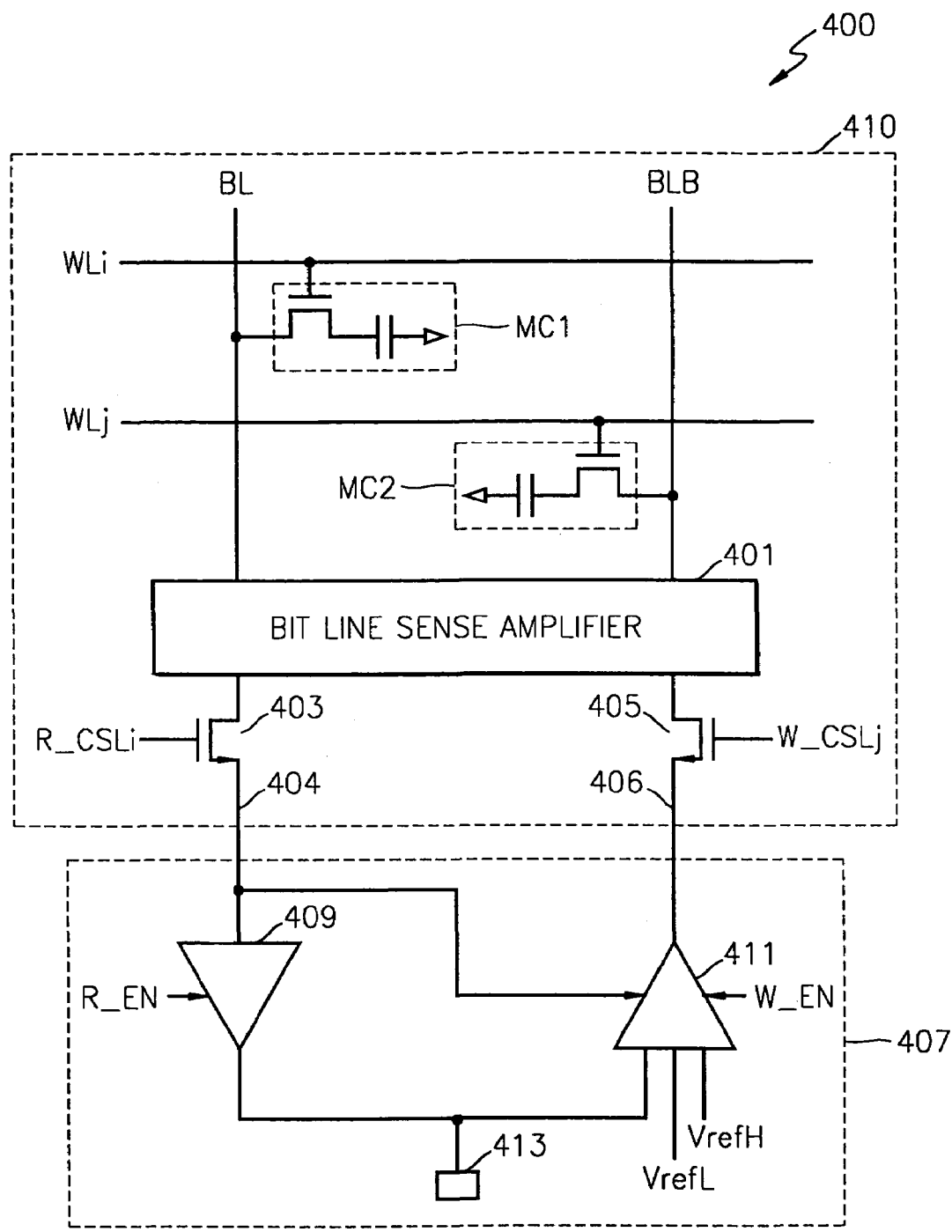
FIG. 4 is a block diagram of a data input/output circuit including the bi-directional input/output pad shown in FIG. 2, according to an embodiment of the present invention.

FIG. 4 is a block diagram related to data input/output of a semiconductor device including a bi-directional input/output pad according to an embodiment of the present invention. Referring to FIG. 4, a semiconductor device 400 includes a memory bank 410 and a bi-directional input/output pad 407. The memory bank 410 includes a plurality of memory cells MC1 and MC2, a bit line sense amplifier 401, a first switching circuit 403, a second switching circuit 405, a data output line 404, and a data input line 406. In an embodiment, the data output line 404 and data input line 406 are two distinct lines.

The plurality of memory cells MC1 and MC2 are located at the intersections of a plurality of bit lines BL and BLB and a plurality of word lines WLi and WLj.

The bit line sense amplifier 401 includes first ports (not shown) and second ports (not shown). Each of the first ports is connected to corresponding bit line BL or BLB, and each of the second ports is connected to a first terminal of corresponding switching circuit 403 or 405.

The first switching circuit 403 may be implemented as an N-channel metal-oxide-semiconductor (NMOS) transistor and connects the data output line 404 to one of the second ports responsive to a first column select signal R_CSLi.

The second switching circuit 405 may be implemented as an NMOS transistor and connects the data input line 406 to one of the second ports responsive to a second column select signal W_CSLj.

In FIG. 4, a single data output line 404 and a single data input line 406 are illustrated for convenience of explanation. However, the number of data output line 404, data input line 406, and bi-directional input/output pad 407 does not limit the present invention.

The first column select signal R_CSLi and the second column select signal W_CLSj are activated independently. However, it is preferable that the first column select signal R_CSLi and the second column select signal W_CLSj are not activated simultaneously in the same memory bank 410.

The first column select signal R_CSLi is intended to activate a column select line in the data read operation. The second column select signal W_CLSj is intended to activate the column select line in the data write operation.

In the data read operation, data to be read is transmitted to an output buffer 409 through the data output line 404. In the data write operation, data to be written is transmitted to the data input line 406 through an input buffer 411.

The bi-directional input/output pad 407 includes the output buffer 409, the input buffer 411, and a pad 413. The operation of the bi-directional input/output pad 407 is the same as that of the simultaneous, bi-directional input/output pad 212 or 242 shown in FIG. 2 or 3.

The output buffer 409 buffers data on the data output line 404 responsive to a read enable signal R_EN and outputs the buffered data to the pad 413.

The input buffer 411 receives a signal (e.g., the signal $V_{BL}$ of the bus 220 of FIG. 2), input through the pad 413, responsive to a write enable signal W_EN, and compares that input signal to a reference voltage VrefH or VrefL. The reference voltage is determined by the level (logic high or low) of the signal on the data output line 404. The input buffer 411 then buffers the input signal according to the comparison result, and transmits the buffered signal to the data input line 406.

When the first switching circuit 403 is switched on responsive to the activated first column select signal R_CSLi, a data output path is formed between a first memory cell MC1 or MC2 and the output buffer 409. Thus, a signal output from the first memory cell MC1 or MC2 is output to the pad 413 through the data output path.

When the second switching circuit 405 is switched on responsive to the activated second column select signal W_CSLj, a data input path is formed between the input buffer 411 of the bi-directional input/output pad 407 and the first memory cell MC1 or MC2. Thus, a signal input through the pad 413 is transmitted to the first memory cell MC1 or MC2 through the data input path.

Figure 5:
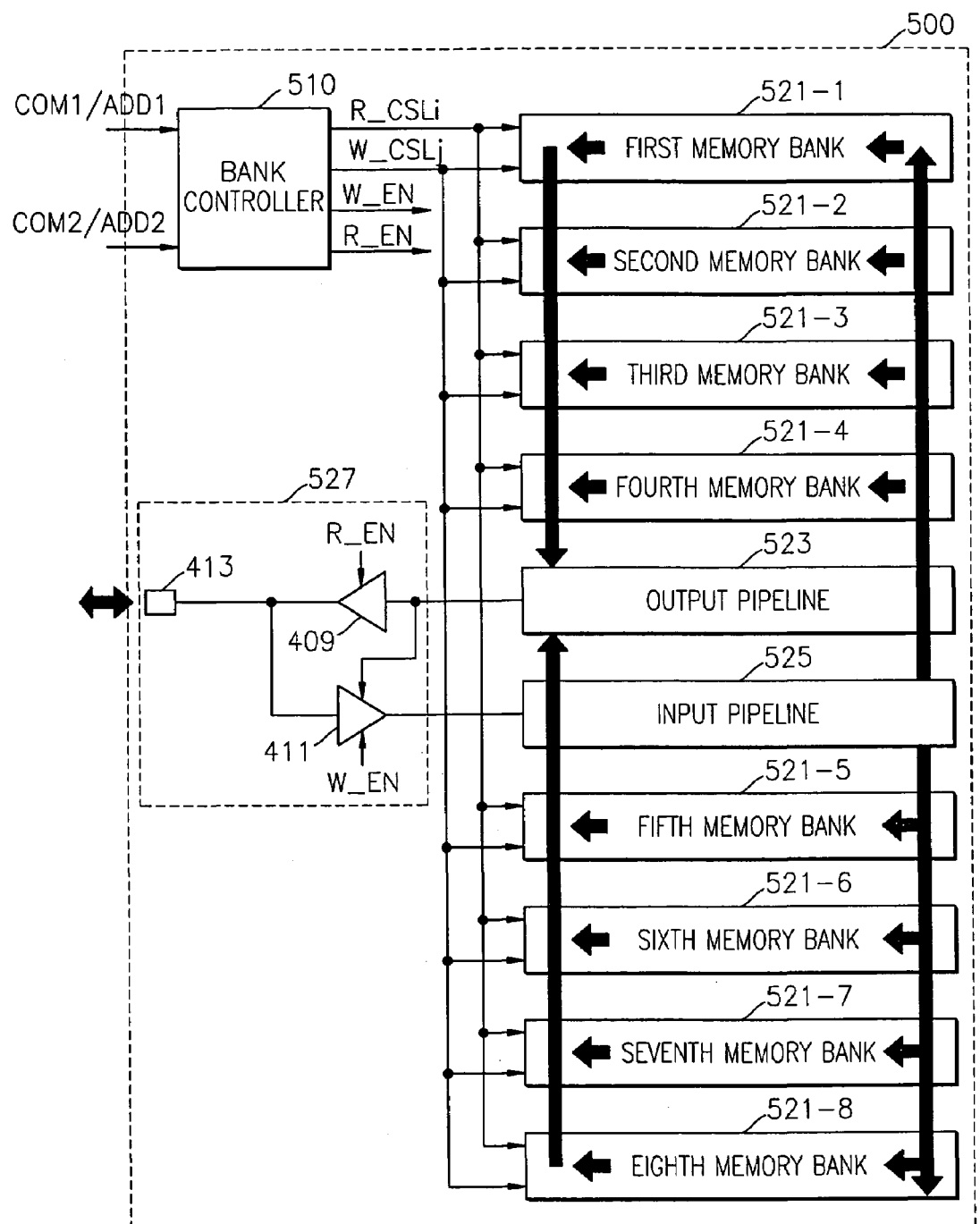
FIG. 5 is a block diagram of a semiconductor device according to an embodiment of the present invention.

FIG. 5 is a block diagram of a semiconductor device according to an embodiment of the present invention. Referring to FIG. 5, a semiconductor device 500 includes a bank controller 510, a plurality of memory banks 521-1 through 521-8, an output pipeline 523, an input pipeline 525, and a bi-directional input/output pad 527.

The bank controller 510 outputs the write enable signal W_EN, the read enable signal R_EN, the first column select signal R_CSLi and/or the second column select signal W_CSLj responsive to a first command signal, a first address COM1/ADD1, a second command signal, and a second address COM2/ADD2.

Here, <i> and <j> range 1–8 and are not equal to each other, i.e., <i>≠<j>. In other words, the data write operation and the data read operation cannot be carried out simultaneously within the same memory bank.

In addition, data read operations cannot be performed simultaneously in two different memory banks, and data write operations cannot be performed simultaneously in two different memory banks.

Each of the plurality of memory banks 521-1 through 521-8 includes the memory bank 410 of FIG. 4 and performs the data read operation responsive to the first column select signal R_CSLi or performs the data write operation responsive to the second column select signal W_CSLj.

The output pipeline 523 includes a predetermined latch (not shown) to temporarily latch data to be read that are output from the plurality of memory banks 521-1 through 521-8 and outputs the latched data to the output buffer 409 of the bi-directional input/output pad 527. The output buffer 409 outputs a signal, output from the output pipeline 523, to the pad 413 responsive to the read enable signal R_EN.

The input buffer 411 of the bi-directional input/output pad 527 receives an input signal, through the pad 413, responsive to the write enable signal W_EN and compares the received signal to the reference voltage VrefH or VrefL that is selected according to the level of the signal output from the output pipeline 523. The input buffer 411 outputs a signal detected to the input pipeline 525 responsive to the comparison.

The input pipeline 525 includes a predetermined latch (not shown) to temporarily latch signals to be input to the plurality of memory banks 521-1 through 521-8 and inputs the latched signals to corresponding memory banks.

Figure 6:
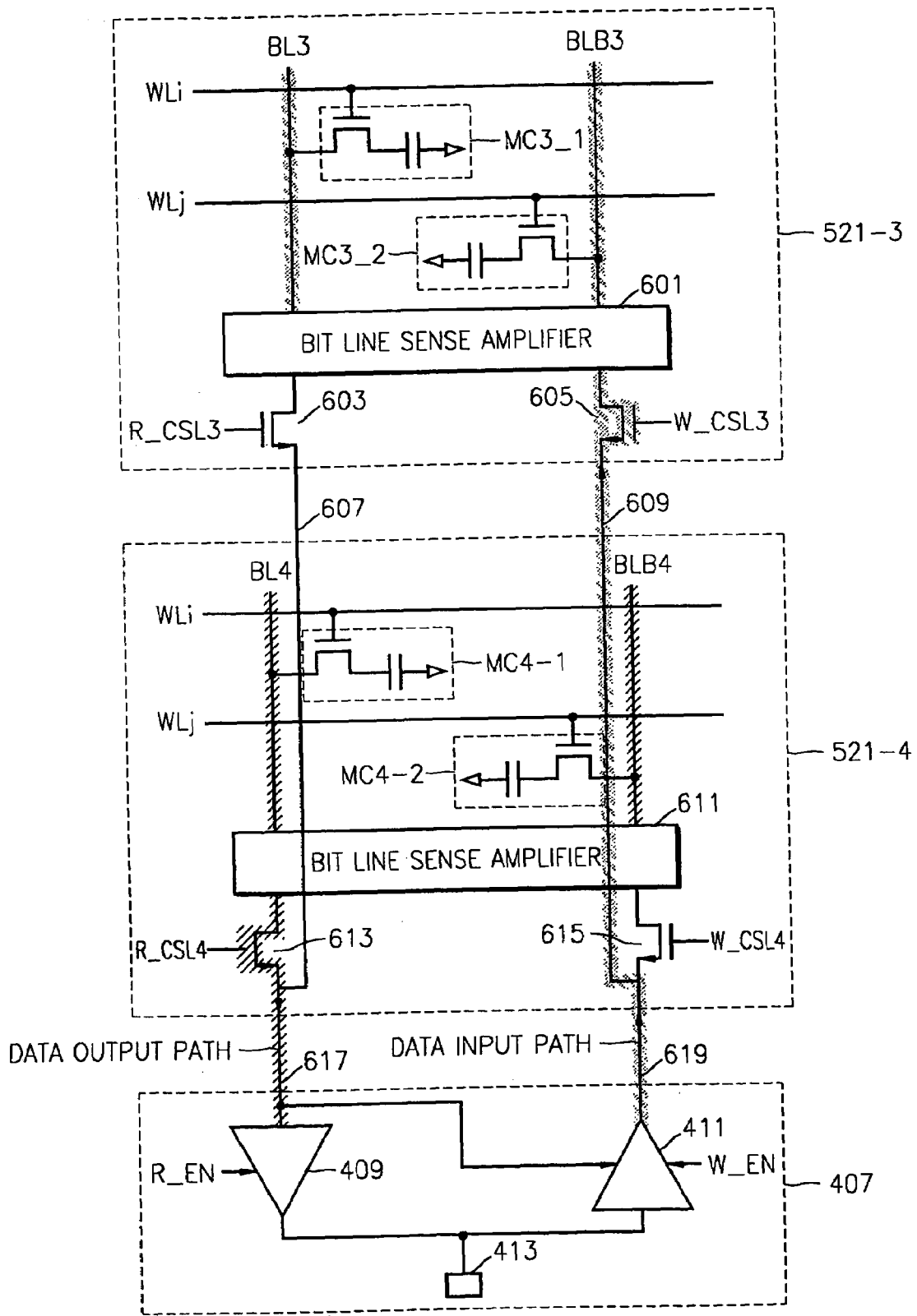
FIG. 6 is a schematic diagram of the semiconductor device shown in FIG. 5.

FIG. 6 is a detailed diagram of the semiconductor device 500 of FIG. 5. With reference to FIGS. 4, 5, and 6, a case where the data write operation is performed in a third memory bank 521-3 and, at the same time, the data read operation is performed in a fourth memory bank 521-4 will be described as follows.

The first column select signal R_CSLi is intended to switch the first switching circuit 403 of a memory bank 521-i and the second column select signal W_CSLj is intended to switch the second switching circuit 405 of a memory bank 521-j.

The bank controller 510 generates an activated second column select signal W_CSL3 and the activated write enable signal W_EN responsive to the first command signal and the first address COM1/ADD1.

At the same time, the bank controller 510 generates an activated first column select signal R_CSL4 and the activated write enable signal R_EN responsive to the second command signal and the second address COM2/ADD2.

Thus, an NMOS transistor 605 of the third memory bank 521-3 is turned on responsive to the activated second column select signal W_CSL3 and an NMOS transistor 613 of the fourth memory bank 521-4 is turned on responsive to an activated first column select signal R_CSL4.

In the data read operation, data, read from a memory cell MC4_1 or MC4_2 of the fourth memory bank 521-4, is output to outside the semiconductor device 500 through a pair of bit lines BL4 and BLB4, a bit line sense amplifier 611, a first switching circuit 613, a data output line 617, the output buffer 409, and the pad 413.

That is, a data output path is formed. The data output lines 607 and 617 can be implemented by the same metal material or different metal materials.

Simultaneously with the data read operation, in the data write operation, data to be written to a memory cell MC3_1 or MC3_2 of the memory bank 521-3 is inputted to memory cell MC3_1 or MC3_2 through the pad 413, the input buffer 411, a data input line 619, a data input line 609, a second switching circuit 605, the bit line sense amplifier 601, and a pair of bit lines BL3 and BLB3.

That is, a data input path is formed. The data output lines 609 and 619 can be implemented by the same metal material or different metal materials.

Thus, data to be written to the third memory bank 521-3 and data output from the fourth memory bank 521-4 can be inputted and outputted simultaneously through the pad 413. Consequently, a bandwidth of the semiconductor device 500 using the bi-directional input/output pad 413 increases by 2 times that of the conventional semiconductor device 100 of FIG. 1.

Figure 7:
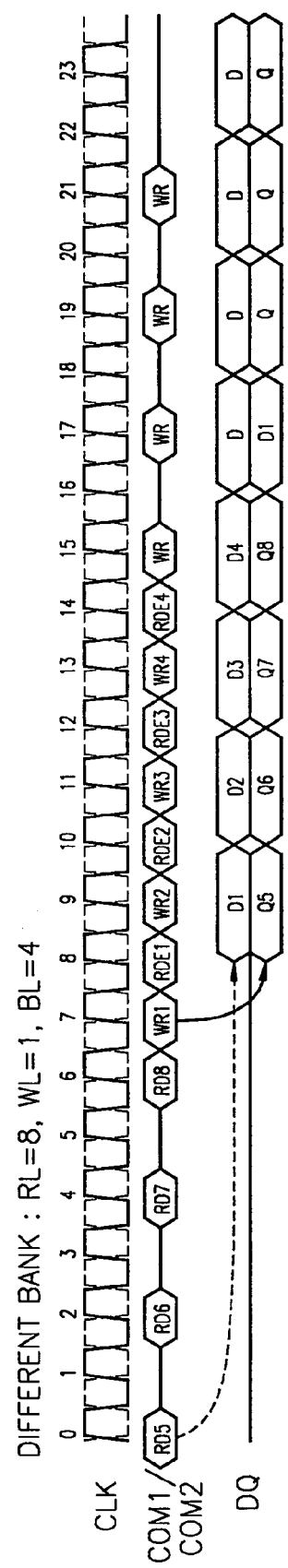
FIG. 7 is a timing diagram of the semiconductor device shown in FIG. 5.

FIG. 7 is a timing diagram for explaining the operation of the semiconductor device 500 of FIG. 5. The timing diagram of FIG. 7 is applied between different memory banks, in which read latency (RL) is an 8-clock cycle, write latency (WL) is a 1-clock cycle, and burst length (BL) is a 4-clock cycle.

Referring to FIGS. 4, 5, and 7, after a read command RD5 for reading data from the fifth memory bank 521-5 is inputted, a command WR1 for writing data to the first memory bank 521-1 is inputted 7-clock cycles later. After the read latency (RL) and the write latency (WL) end, data D1 is read from the fifth memory bank 521-5 and transmitted through the data output path to the pad (DQ) 413. While, at the same time, the data Q5 to be written to the first memory bank 521-1 is inputted through the pad (DQ) 413 and the data input path.

A read command RDE1 is intended to enable the data read operation in one of the plurality of memory banks except the first memory bank 521-1. A read command RDE2 is intended to enable the data read operation in one of the plurality of memory banks except the memory bank 521-2. Accordingly, when the data write operation is carried out in the first memory bank 521-1 responsive to the write command WR1, the data read operation cannot be performed in the first memory bank 521-1.

As described above, an apparatus for and a method of inputting and outputting data simultaneously through a single bi-directional input/output pad according to the present invention can reduce a width of a bus used between semiconductor devices according to the present invention by half.

While the present invention has been particularly shown and described with reference to an exemplary embodiment thereof, it will be understood by those of ordinary skill in the art that various changes in form and details may be made without departing from the spirit and scope of the invention as defined by the appended claims and their equivalents.

I claim:

1. A semiconductor device, comprising:
   a bi-directional input/output pad including an output buffer and an input buffer;
   a data output line coupled to the output buffer;
   a data input line coupled to the input buffer;
   a bit line sense amplifier coupled to a plurality of bit lines;
   a first switching circuit coupled to the data output line; and
   a second switching circuit coupled to the data input line;
   where the input buffer compares an input signal from the bi-directional input/output pad with a reference voltage in response to a signal from the output buffer; and
   where the input buffer generates an output signal as a result of the comparison.

2. A semiconductor device, comprising:
   a bi-directional input/output pad including an output buffer and an input buffer;
   a data output path formed between a first memory cell and the output buffer;
   a data input path formed between a second memory cell and the input buffer; and
   where the input buffer compares an input signal with a reference voltage and generates a signal responsive to the comparison.

3. A semiconductor device comprising:
   a plurality of memory banks; and
   a bi-directional input/output pad to input and output data;
   where each of the plurality of memory banks comprises;
      a plurality of memory cells;
      a data output line to transmit read data from a corresponding memory cell to the bi-directional input/output pad in a read mode; and
      a data input line to transmit write data to a corresponding memory cell from the bi-directional input/output pad in a write mode;
      where the read mode is performed in one memory bank, the read data is transmitted to the bi-directional input/output pad through the data output line; and
      where the write mode is performed in another memory bank substantially simultaneously with the read mode, the write data is transmitted to the data input line from the bi-directional input/output pad.

4. A semiconductor device comprising:
   a plurality of memory banks; and
   a bi-directional input/output pad;
   where each of the plurality of memory banks comprises:
      a data output path formed between a first memory cell and the bi-directional input/output pad responsive to activation of a first column select signal; and
      a data input pat formed between a second memory cell and the bi-directional input/output pad responsive to activation of a second column select signal;
   where the first column select signal forming the data output path for one memory bank and the second column select signal forming the data input path for another memory bank are activated substantially simultaneously.

5. The semiconductor device of claim 4
   where the bi-directional input/output pad includes an output buffer and an input buffer;
   where the data output path is formed between the first memory cell and the output buffer; and
   where the data input path is formed between the second memory cell and the input buffer.

6. A method for inputting and outputting data through a single bi-directional input/output pad coupled to a data output line and a data input line, comprising:
   transmitting read data from a first memory cell through the data output line to the bi-directional input/output pad; and
   substantially simultaneously transmitting write data from the bi-directional input/output pad through the data input line to a second memory cell.

7. The method of claim 6 comprising:
   coupling the data output line between the bi-directional input/output pad and the first memory cell; and
   coupling the data input line between the bi-directional input/output pad and the second memory cell, the data input line being separate from the data output line.

8. The method of claim 7 where coupling the data output line and coupling the data input line occur substantially simultaneously.

9. The method of claim 6 comprising:
generating a first column select signal and a second column select signal; and
coupling the data output line between the bi-directional input/output pad and the first memory cell responsive to the first column select signal;
substantially simultaneously coupling the data input line between the bi-directional input/output pad and the second memory cell responsive to the second column select signal, the data input line being distinct from the data output line.

10. The semiconductor device of claim 1
where the input buffer receives a plurality of reference voltages from a reference voltage generating circuit; and
where the input buffer compares the input signal with at least one of the reference voltages according to the signal from the output buffer.

11. The semiconductor device of claim 1 where the input buffer provides the output signal on the data input line.

12. The semiconductor device of claim 2
where the input buffer receives a plurality of reference voltages; and
where the input buffer compares the input signal with at least one of the reference voltages according to a data value read from the first memory cell through the data output path.

13. The semiconductor device of claim 11 where the input signal includes the generated signal combined with the data value read from the first memory cell.

14. The semiconductor device of claim 2 where the input buffer writes the generated signal to the second memory cell through the data input path.

* * * * *

UNITED STATES PATENT AND TRADEMARK OFFICE
CERTIFICATE OF CORRECTION

| | |
|---|---|
| PATENT NO. | : 7,023,742 B2 |
| APPLICATION NO. | : 10/819678 |
| DATED | : April 4, 2006 |
| INVENTOR(S) | : Choi |

Page 1 of 1

It is certified that error appears in the above-identified patent and that said Letters Patent is hereby corrected as shown below:

At column 8, line 14, please replace "comprises;" with --comprises:--;

At column 8, line 37, please replace "data input pat" with -- data input path--.

Signed and Sealed this

Third Day of July, 2007

JON W. DUDAS
*Director of the United States Patent and Trademark Office*